(12) United States Patent
Chen et al.

(10) Patent No.: US 8,519,476 B2
(45) Date of Patent: Aug. 27, 2013

(54) METHOD OF FORMING A SELF-ALIGNED CHARGE BALANCED POWER DMOS

(75) Inventors: John Chen, Palo Alto, CA (US);
Yeeheng Lee, San Jose, CA (US);
Lingpeng Guan, Sunnyvale, CA (US);
Moses Ho, Campbell, CA (US); Wilson Ma, Sunnyvale, CA (US); Anup Bhalla, Santa Clara, CA (US); Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 735 days.

(21) Appl. No.: 12/643,837

(22) Filed: Dec. 21, 2009

(65) Prior Publication Data

US 2011/0147830 A1    Jun. 23, 2011

(51) Int. Cl.
*H01L 29/66*    (2006.01)
(52) U.S. Cl.
USPC .................... 257/330; 257/335; 257/E21.421
(58) Field of Classification Search
USPC ................................. 257/330, 335, E21.421
See application file for complete search history.

(56) References Cited

U.S. PATENT DOCUMENTS

| | | | |
|---|---|---|---|
| 7,061,060 B2* | 6/2006 | Yasuhara et al. | 257/409 |
| 7,259,426 B2* | 8/2007 | Aida et al. | 257/341 |
| 7,595,241 B2* | 9/2009 | Matocha et al. | 438/268 |
| 2008/0050876 A1 | 2/2008 | Matocha et al. | |
| 2008/0185643 A1* | 8/2008 | Hossain | 257/342 |
| 2009/0179263 A1* | 7/2009 | Guarnera et al. | 257/334 |
| 2009/0194811 A1* | 8/2009 | Pan et al. | 257/330 |
| 2009/0294917 A1 | 12/2009 | Yajima | |

* cited by examiner

*Primary Examiner* — David Vu
*Assistant Examiner* — Brandon Fox
(74) *Attorney, Agent, or Firm* — Joshua D. Isenberg; JDI Patent

(57) ABSTRACT

Self-aligned charge balanced semiconductor devices and methods for forming such devices are disclosed. One or more planar gates are formed over a semiconductor substrate of a first conductivity type. One or more deep trenches are etched in the semiconductor self-aligned to the planar gates. The trenches are filled with a semiconductor material of a second conductivity type such that the deep trenches are charge balanced with the adjacent regions of the semiconductor substrate This process can form self-aligned charge balanced devices with a cell pitch less than 12 microns.

15 Claims, 9 Drawing Sheets

METHOD OF FORMING A SELF-ALIGNED CHARGE BALANCED POWER DMOS

FIELD OF THE INVENTION

This invention generally relates to metal oxide semiconductor field effect transistors (MOSFETs) and more particularly to a method of forming a self-aligned charge balanced power double diffused metal oxide semiconductor field effect transistors (DMOSFET).

BACKGROUND OF THE INVENTION

Power MOSFETs have typically been developed for applications requiring power switching and power amplification. For power switching applications, the commercially available devices are typically double diffused MOSFETs (DMOSFETs). In a typical transistor, much of the breakdown voltage BV is supported by a drift region, which is lowly doped in order to provide a higher breakdown voltage BV. However, the lowly doped drift region also produces high on-resistance $R_{ds-on}$. For a typical transistor, $R_{ds-on}$ is proportional to $BV^{2.5}$. $R_{ds-on}$ therefore increases dramatically with increase in breakdown voltage BV for a conventional transistor.

Superjunctions are a well known type of semiconductor device. Superjunction transistors provide a way to achieve low on-resistance ($R_{ds-on}$), while maintaining a high off-state breakdown voltage (BV). Vertical superjunction devices include alternating P-type and N-type doped columns formed in the drift region. In the OFF-state of the MOSFET, the columns completely deplete at relatively low voltage and thus can sustain a high breakdown voltage (the columns deplete laterally, so that the entire p and n columns are depleted). For a superjunction, the on-resistance $R_{ds-on}$ increases in direct proportion to the breakdown voltage BV, which is a much less dramatic increase than in the conventional semiconductor structure. A superjunction device may therefore have significantly lower $R_{ds-on}$ than a conventional MOSFET device for the same high breakdown voltage (BV) (or conversely may have a significantly higher BV than a conventional MOSFET for a given $R_{ds-on}$).

U.S. Pat. No. 4,754,310 discloses a semiconductor device, such as a diode or transistor, that comprises a semiconductor body having a depletion layer formed throughout a portion in at least a high voltage mode of operation of the device, such as, by reverse biasing a rectifying junction. The depleted body portion comprising an interleaved structure of first and second regions of alternating conductivity types carries the high voltage which occurs across the depleted body portion. The thickness and doping concentration of each of these first and second regions are such that when depleted the space charge per unit area formed in each of these regions is balanced at least to the extent that an electric field resulting from any imbalance is less than the critical field strength at which avalanche breakdown would occur in the body portion. The first regions in at least one mode of operation of the device provide electrically parallel current paths extending through the body portion.

U.S. Pat. No. 6,818,513 to Marchant discloses a method of forming a superjunction trench gate field effect transistor device. FIG. 1A is a cross-sectional view of the superjunction trench gate field effect transistor device of Marchant. In the Marchant method a well region of a second conductivity type is formed in a semiconductor substrate 29 that has a major surface, an N-epitaxial portion 32 and a drain region 31 and is made of a first conductivity type, e.g., N-type. A source region 36 of the first conductivity type is formed in the well region and a trench gate electrode 43 is formed adjacent to the source region. A P-stripe trench 35 is formed extending from the major surface of the semiconductor substrate 29 into the semiconductor substrate to a predetermined depth. A semiconductor material of the second conductivity type, e.g., P-type, is deposited within the stripe trench 35. Each N+ source region 36 is adjacent to one of the gate structures 45 and is formed in a plurality of P-well regions 34, which are also formed in the semiconductor substrate 29. Each P-well region 34 is disposed adjacent to one of the gate structures 45. A contact 41 for the source regions 36 is present on the major surface 28 of the semiconductor substrate 29. The regions between the stripes 35 are quickly depleted of charge carriers as the depletion region 32 expands from the side-surfaces of adjacent stripes 35. FIG. 1B is cross-sectional view of another trench gate superjunction field effect transistor device of Marchant. As shown in this figure, the stripe 35 comprises a P-layer 35(a) and an inner dielectric material 35(b) that may be formed by oxidizing the P-layer 35(a) or a material such as silicon dioxide or air. However, the method of Marchant takes a lot of steps to etch and fill the stripe trench, which tends to increase the cost of devices that contain superjunction transistors made with the Marchant method. In addition, the stripe trench 35 is not self-aligned and the active cell pitch, i.e., from device trench to device trench, cannot be made smaller than about 12 µm to 16 µm.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In embodiments of the present invention, a superjunction transistor can be formed in a self-aligned fashion that allows for higher cell pitch, better process control and can use fewer photoresist masks. Using fewer masks can lower the production costs.

FIGS. 2A-2M illustrate an example of superjunction fabrication according to an embodiment of the present invention.

Figure 1A:
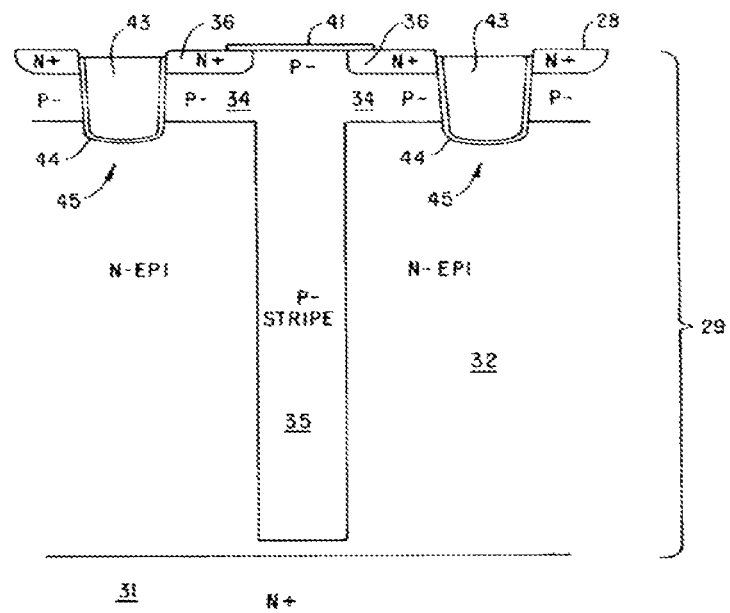
FIGS. 1A-1B are cross-sectional views of the superjunction field effect transistor device of the prior art.
Figure 1B:
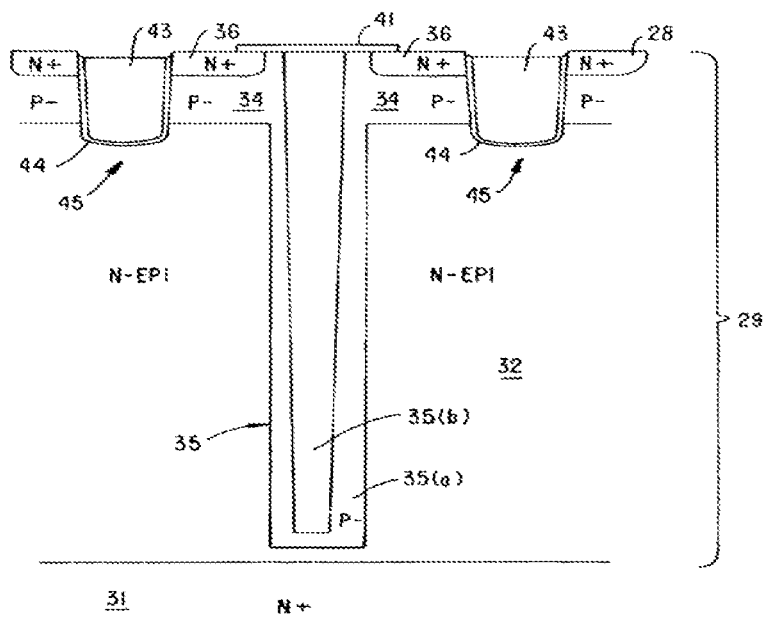
Figure 2A:
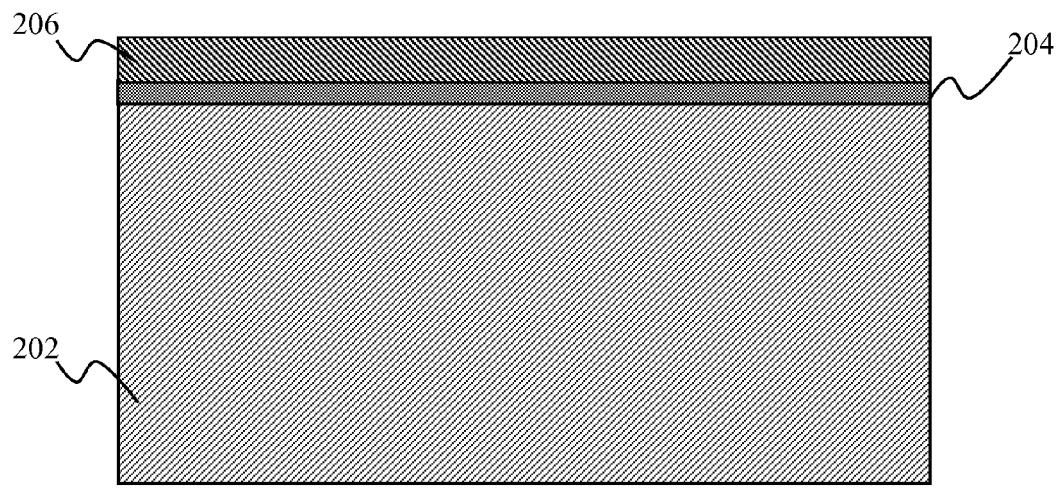
FIGS. 2A-2M are cross-sectional views illustrating a method of forming a self-aligned charge balanced power double diffused metal oxide semiconductor field effect transistors (DMOSFET) according to an embodiment of the present invention.

As shown in FIG. 2A, fabrication may begin using a semiconductor substrate 202 as a starting material. By way of example, and not by way of limitation, the semiconductor substrate 202 may include an epitaxial (epi) layer that may be grown, deposited, or otherwise formed on a more heavily doped semiconductor bottom substrate by standard techniques. By way of example, the semiconductor substrate 202 may be made of silicon (Si) material. A first insulating layer 204 (e.g., an oxide layer) can be grown, deposited or otherwise formed on top of the substrate 202. The first insulating layer 204 can be about 100 Angstroms (A) to about 500 Å thick. A second insulating layer 206 can be deposited on top of selected portions of the oxide layer 204. The second insulating layer 206 can be made of a hard mask material that is resistant to an etch process that etches the first insulating layer 204. For example, if the first insulating layer 204 is an oxide, e.g., silicon dioxide, the second insulating layer 206 can be a nitride, e.g., silicon nitride. A thickness of the second insulating layer 206 can be about 1000 Å to about 3000 Å.

Figure 2B:
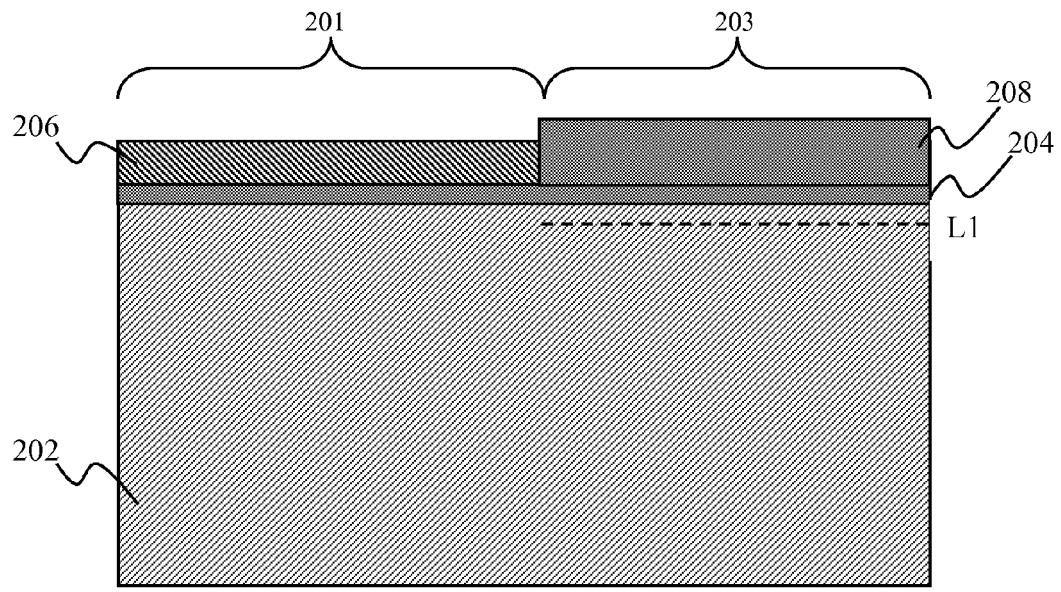

The second insulating layer 206 can be patterned, e.g., with a photoresist mask, to define a device area 201 and a termination area 203. For example, as shown in FIG. 2B a first field mask (not shown) can be deposited on top of the second insulating layer 206. A portion of the second insulating layer 206 at the termination area 203 can then be etched through the field mask. Dopants of an opposite type to the dopants of the substrate 202 can be implanted into the termination region 203 to form a junction termination extension (JTE) region up to line L1. JTE is a type of chip termination structure design used to reduce electric field crowding by implanting dopants into the substrate forming an extended P-N junction from the main device region into the termination region. The first field mask can then be removed. A third insulating layer 208 (e.g., a field oxide layer) can be grown on top of the termination region 203, over the JTE region. A thickness of the third insulating layer 208 can be about 3000 Å to 6000 Å.

Figure 2C:
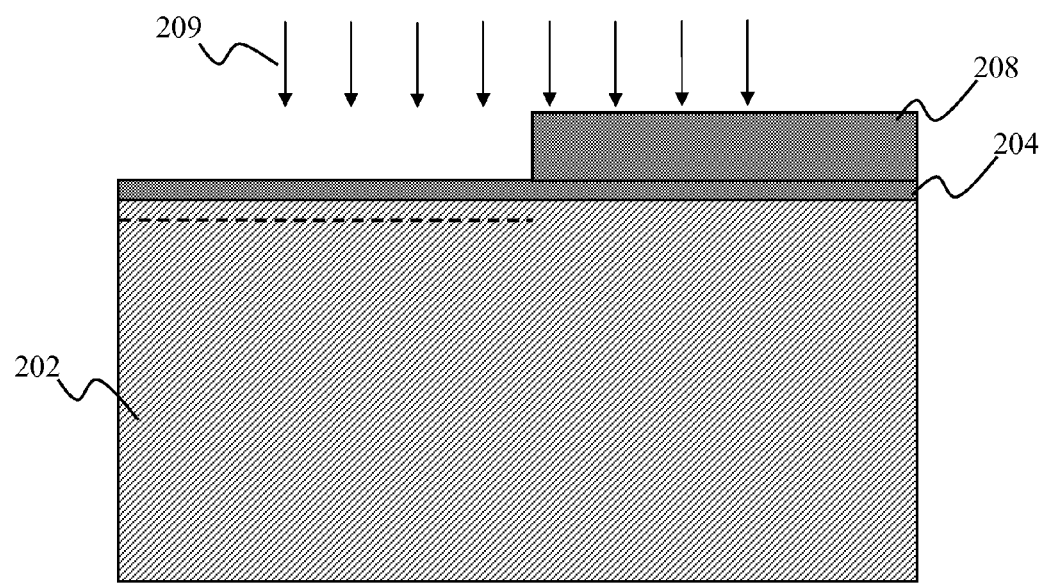

As shown in FIG. 2C, a remaining portion of the second insulating layer 206 at the device area 201 can be removed. A blanket junction field effect transistor (JFET) implant, which is used to control channel doping concentration and its conductivity, can be performed by doping the device region 201 with dopants 209 that are of an opposite type to the dopants of the substrate 202. Alternatively, a body implant can be performed in a top portion of the substrate 202. The JFET implant and the JTE implant are design parameters whose depth and concentration can be adjusted separately.

Figure 2D:
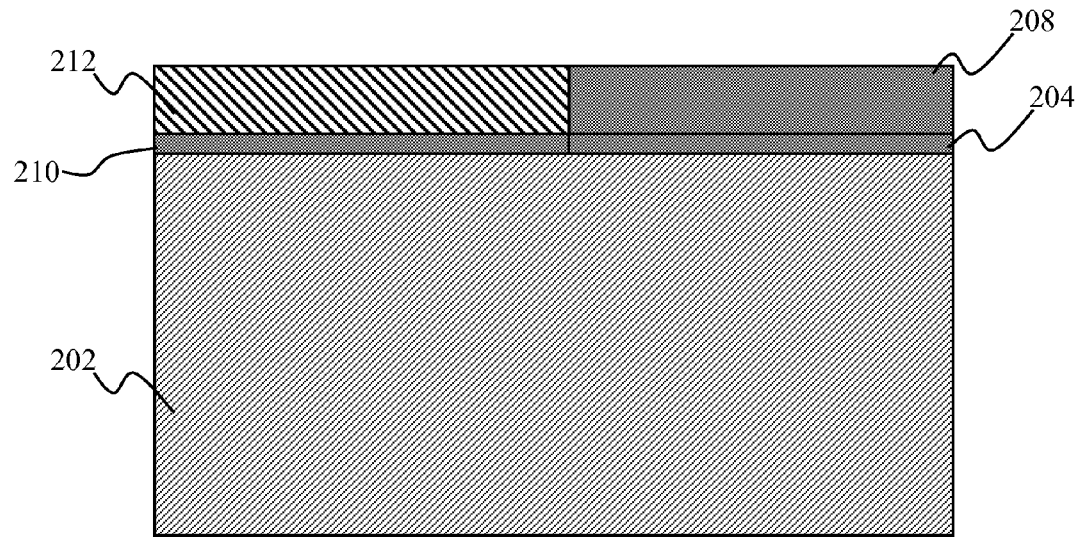

As shown in FIG. 2D, an exposed portion of the first insulating layer 204 at the device area 201 can be removed down to the surface of the substrate 202. A gate insulator 210 (e.g., a gate oxide) can then be grown on top of the exposed portion of the substrate 202 at the device area 201. An electrically conducting layer can then be deposited on top of the gate insulator layer 210 to provide a gate electrode 212 also referred to herein as a gate. By way of example, the electrically conducting layer may be a layer of polycrystalline silicon, also known as polysilicon or poly. The conductive material forming the gate 212 can be about 4000 Å to 6000 Å thick. Selected portions of the electrically conducting layer that forms the gate 212 can then be removed such that the top surface of the gate 212 is level with the top surface of the third insulating layer 208. By way of example, and not by way of limitation, a second field mask (not shown) can be patterned on top of the structure formed by the insulating layers 204, 206, 208, gate insulator 210 and gate 212. Alternatively, the polysilicon may be planarized by CMP (chemical mechanical polishing) to the top surface of the third insulating layer 208. Selected portions of the polysilicon can be etched through openings in the field mask, which can be removed after the etch process is completed.

Figure 2E:
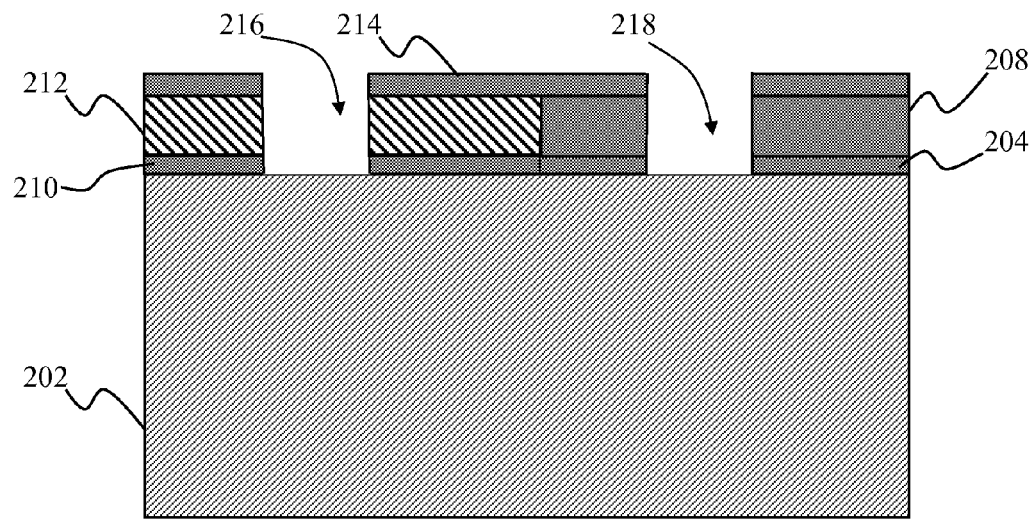

Referring to FIG. 2E, a fourth insulating layer 214 (e.g., an oxide layer) can be deposited on top of the third insulating layer 208 and gate 212. A photoresist mask (not shown) can then be formed on top of the structure and patterned. Selected portions of the fourth insulating layer 214, the electrically conducting layer that forms the gate 212 and the gate insulator layer 210 can then be etched down to the semiconductor substrate 202 to form a first opening 216. The fourth insulating layer 214, the third insulating layer 208 and the first insulating layer 204 can also be etched to the semiconductor substrate 204 to form a second opening 218. By way of example, and not by way of limitation, a depth of the first opening 216 can be sufficiently deep to expose the underlying surface of the substrate 202. The photoresist mask can be removed after the etching is finished. Source and body regions can be formed at this stage, e.g., by implanting suitable dopant ions through the openings 216, 218. However the source and body regions can also be formed later in the process, e.g., as described below with respect to FIG. 2J. After forming the openings 216, 218, the remaining portions of conductive layer 212, gate oxide 210, and insulating layer 214 act as a hard mask for a subsequent deep trench etch. The remaining portions of conductive layer 212 form the planar gate for the eventual power device. Thus, the planar gate structure acts as a hard mask for the subsequent deep trench etch.

Figure 2F:
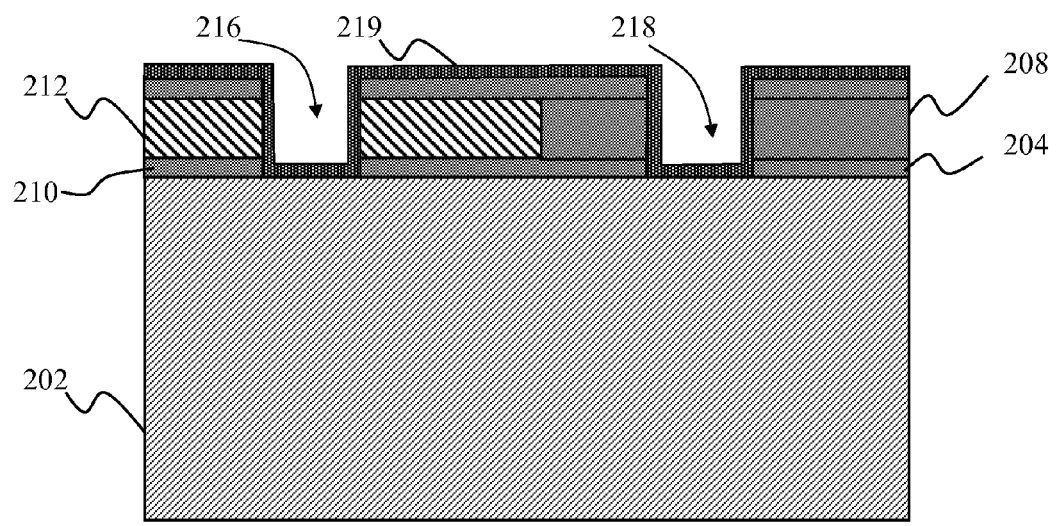
Figure 2G:
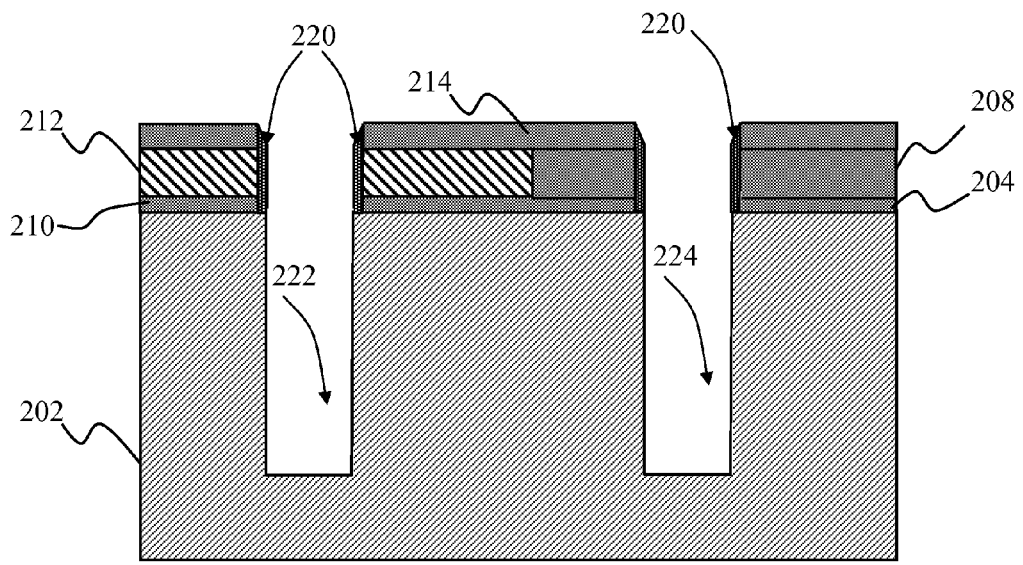

After forming the openings 216, 218, exposed portions of the electrically conductive layer 212 inside the opening 216 can optionally be oxidized. A thin insulating layer 219 made of an etch resistant material (e.g., a nitride) can be deposited or otherwise formed to line the bottoms and sidewalls of the hard mask openings 216 and 218 as shown in FIG. 2F. By way of example, and not by way of limitation, a thickness of the thin insulating layer 219 can be about 1000 Å. Horizontal portions of the thin insulating layer 219 on top of the structure formed by the insulating layers, 204, 208, 214, gate insulator 210 and electrically conductive layer 212 and thin insulating layer 219 and on the bottom of the hard mask openings 216 and 218 can be anisotropically etched to form sidewall spacers 220 from portions of the thin insulating layer 219 on the hard mask opening sidewalls as shown in FIG. 2G. Oxidizing the exposed portions of the gate electrode 212 and forming sidewall spacers 220 may protect the gate electrode when etching the deep trenches and growing an epitaxial layer in the deep trenches, as described below.

Next, the substrate 202 can be etched to a predetermined depth to form deep trenches 222 and 224 at positions corresponding to the hard mask openings 216, 218 respectively. Thus the deep trenches 222 are self-aligned to the planar gate 212. By way of example, and not by way of limitation, the trench depth can be up to about 100 μm depending on device design. It is desirable for the etch process that forms the hard mask openings 216, 218 to be one that preferably etches the material of the substrate but not the materials that form the sidewall spacers 220 or the fourth insulator 214. During the etching of the substrate 202, the sidewall spacers 220 provide offset for the self-alignment for forming the trenches. More specifically, the sidewall spacers 220 provide offset between the deep trenches 222 and the gate electrode 212. Due to the self-alignment to the planar gate structure 212, the trenches can be formed in the substrate without the use of a photoresist mask. Furthermore, the self-alignment allows for a higher pitch between adjacent cells than would be possible if the trenches were etched by a process that uses non-self aligned mask.

Figure 2H:
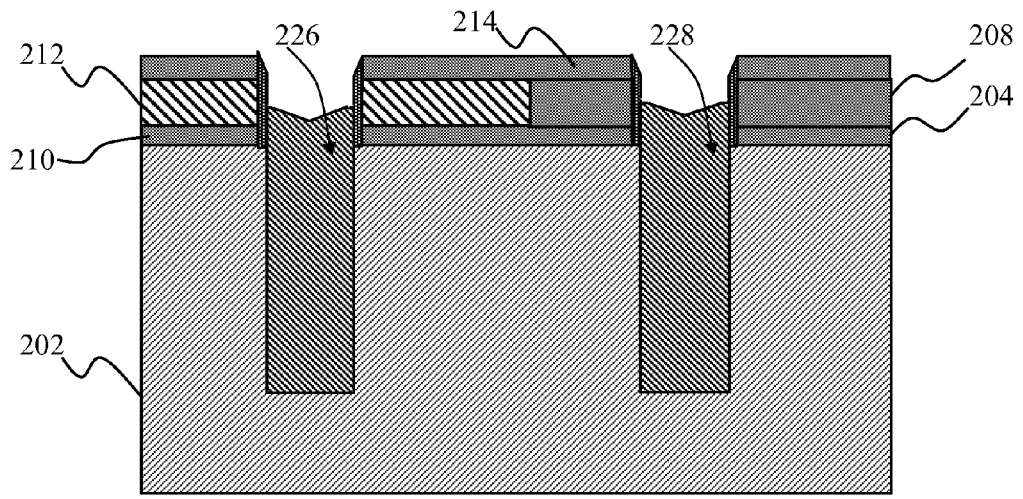

After the trenches 222, 224 have been formed, semiconductor plugs 226 and 228 can be selectively deposited, grown or otherwise formed to fill the trenches 222 and 224 as shown in FIG. 2H. By way of example and not by way of limitation, the semiconductor plugs 226, 228 can be selectively formed in the trenches 222 or 224 by selective epitaxial growth. For example, the structure can be pre-conditioned, e.g., annealing in a hydrogen atmosphere. A selective epitaxial growth (SEG) layer can then be grown. The SEG layer can be Silicon (Si). Alternatively, the SEG layer can be Silicon-Germanium) $Si_xGe_y$, e.g., containing 1-20% Ge. The advantage of growing $Si_xGe_y$ is that the doping dose can be 10 times higher than the doping dose for silicon. For example, normally for Si, dopant concentration is about $10^{18}$-$10^{19}$ cm$^{-3}$ and for $Si_xGe_y$ is about $10^{20}$-$10^{21}$ cm$^{-3}$. In addition, the lattice mismatch between Si and $Si_xGe_y$ at the sidewall can cause strain which actually enhances the charge carrier mobility, e.g., by as much as 50%. It is noted that the epitaxial layer only grows on exposed semiconductor material. Therefore, the semiconductor plugs 226, 228 can be selectively formed in the trenches 222, 224 without the use of an additional mask. The planar gate 212 with the overlying fourth insulating layer 214 acts as a hard mask for the SEG process. The nitride sidewalls 220 may help prevent epitaxial growth on the sides of the planar gate 212. The semiconductor plugs 226, 228 are formed having opposite conductivity type as the substrate 202. If the semiconductor substrate 202 is of the first conductivity type, then the semiconductor plugs 226, 228 form columns of a second conductivity type having the appropriate doping concentration and width so that they are charge balanced with the adjacent portions of the semiconductor substrate 202. These columns are self aligned to the planar gate 212.

Figure 2I:
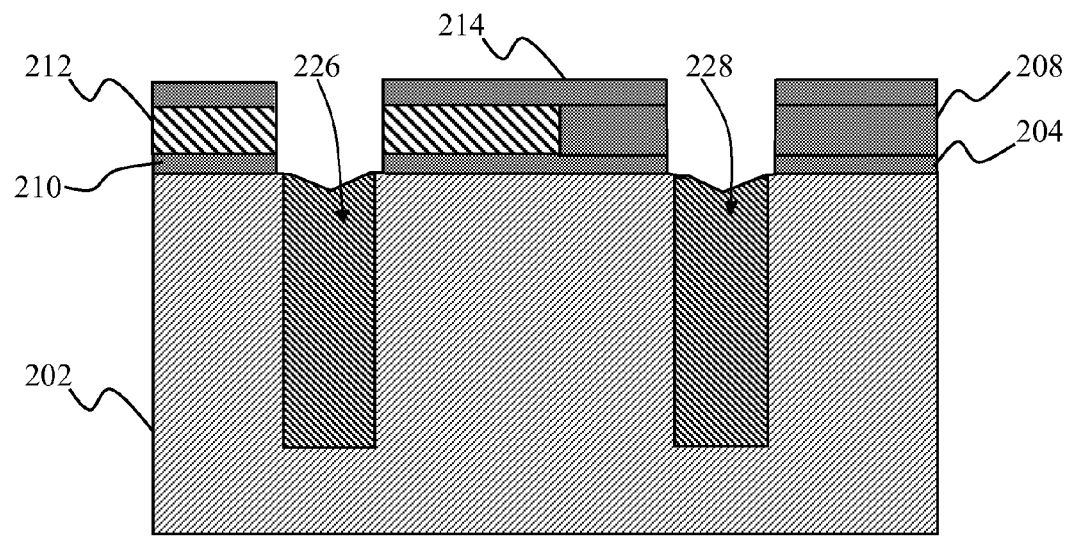

Referring to FIG. 2I, the silicon plugs 226 and 228 can be etched back to about the same level as the surface of the substrate 202. The spacers 220 are then removed.

Figure 2J:
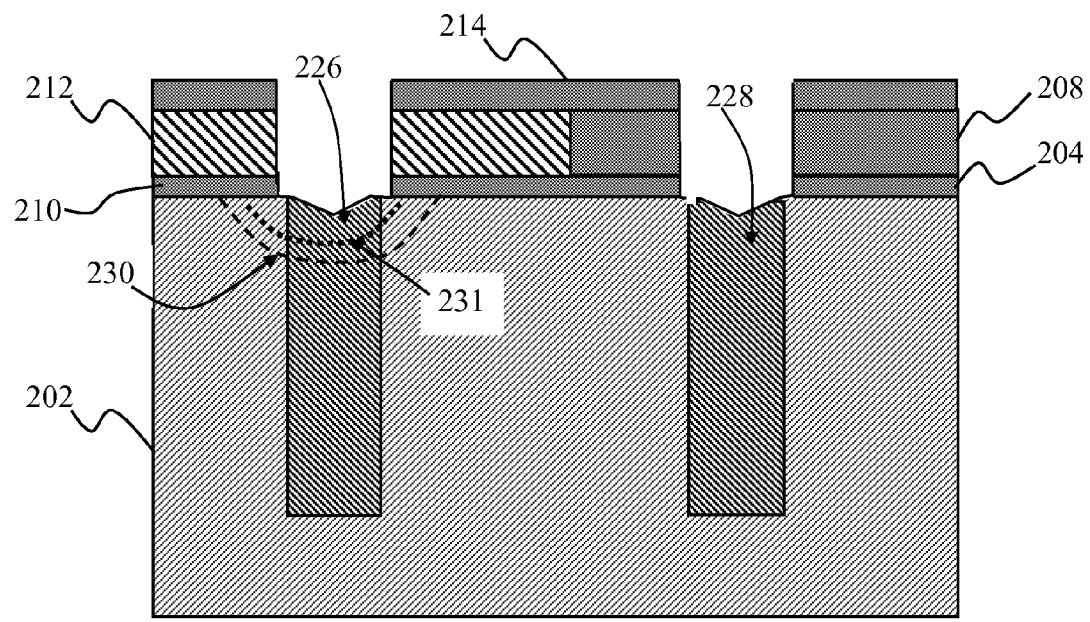

A body mask (not shown) covering the termination area, is then applied on top of the structure, followed by a body implant to form body region 230 as shown in FIG. 2J. The implantation can be performed by implanting the dopant ions at a tilted angle with respect to the substrate 202. By way of example, and not by way of limitation, the substrate 202 may be tilted such that its normal (i.e., a direction perpendicular to the plane of the surface of the substrate) is at an angle about 10°-15° with respect to the direction of a beam of ions. While tilted, the substrate 202 may be rotated during implantation. After implantation, the body mask can be removed. A source mask (not shown) can be applied to block the termination region followed with a source implantation to form a source region 231. The source implantation can be performed vertically, i.e., with the nominal direction of ion implantation being perpendicular to the semiconductor substrate 202 surface. After source implantation, the source mask can be removed. A thermal diffusion can then be performed to drive-in the implanted ions. The source and body regions are thus also self-aligned to the planar gate 212.

Figure 2K:
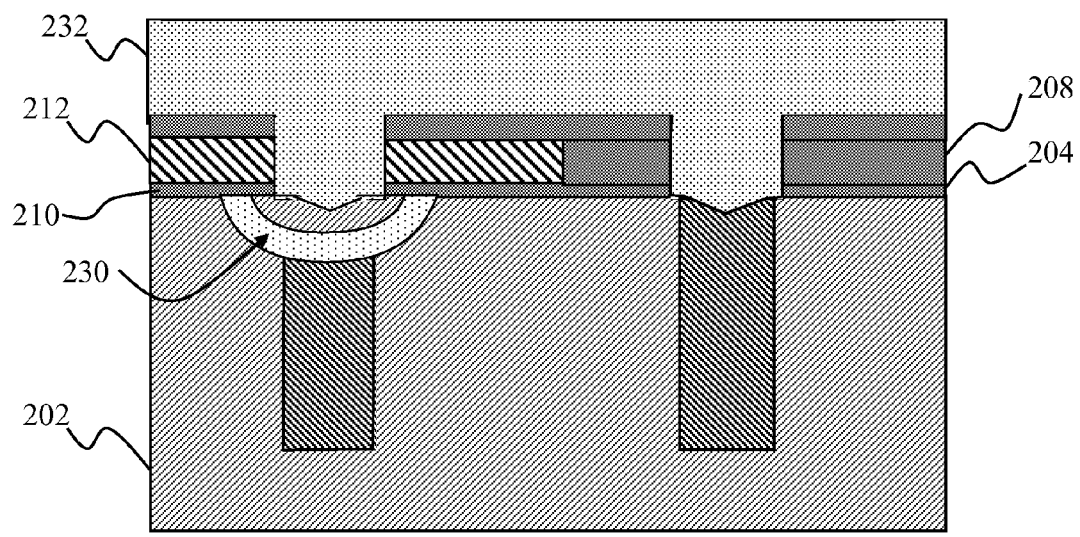
Figure 2L:
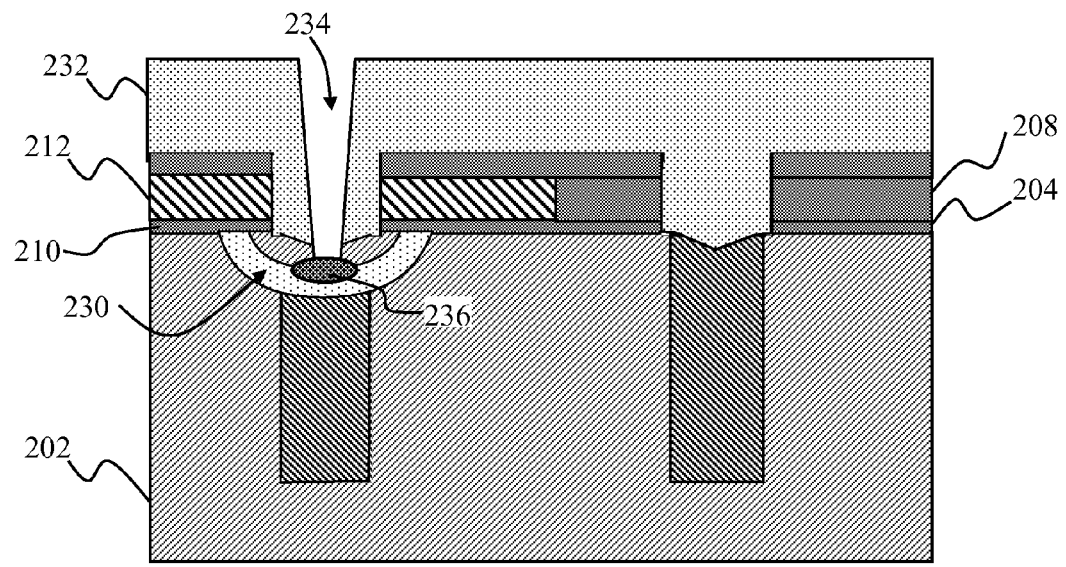
Figure 2M:
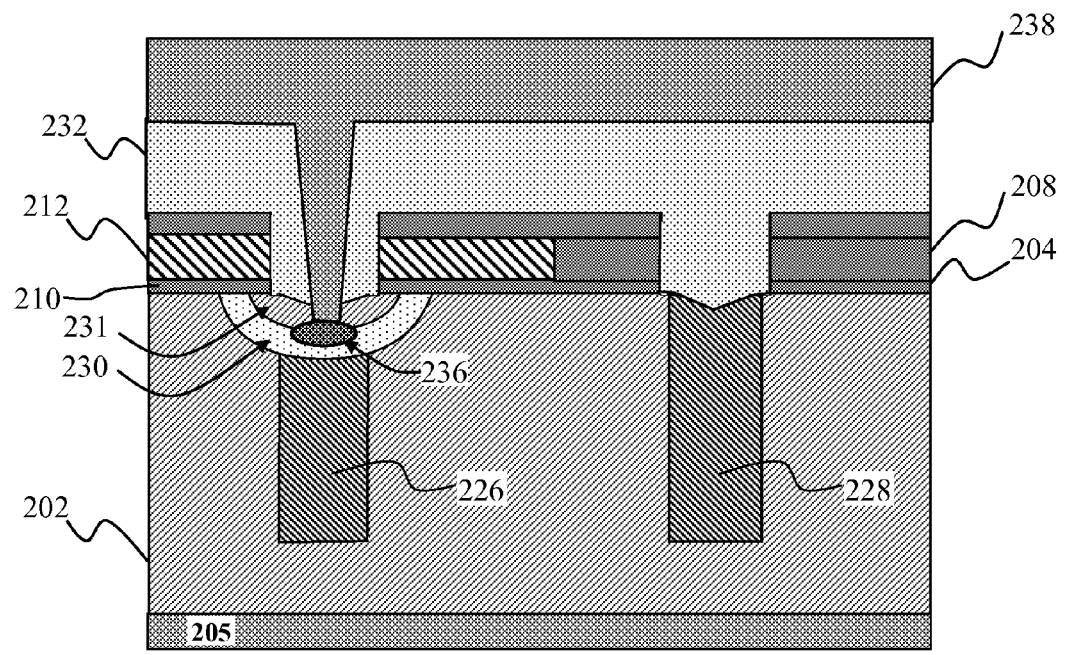

As shown in FIG. 2K, a fifth insulator layer 232 (e.g., an oxide) can be filled into the openings 216 and 218 and on top of the structure formed by the insulating layers 204, 208, 214, gate insulator 210, electrically conductive material 212 and semiconductor plugs 226, 228. A contact mask (not shown) can be applied on top of the fifth insulator layer 232 for forming a body contact. Portions of the fifth insulator layer 232 in the trench 216 can be etched through the contact mask to form a contact opening 234. The contact opening 234 may extend slightly into the source region 231 of the semiconductor plug 226. A body contact implantation can be performed through the contact opening 234 to form a body contact 236 as shown in FIG. 2L, to allow good contact to the body region 230. A metal 238, such as Tungsten, can be deposited into the contact opening 234 to contact the source 231 and the body contact 236. Metal may also be formed on top of the fifth insulating layer 232 to complete the planar gate power DMOS device as shown in FIG. 2M. When an appropriate voltage is applied to the planar gate 212 an electrically conductive path can form from the source region 231 through the body region 230 to the substrate 202. The substrate 202 acts as the drain of the power DMOS. A metal layer may be formed on the bottom of the substrate 202 as a drain metal 205. The portions of the semiconductor substrate 202 adjacent to the semiconductor plugs 226, 228 act as a drain drift region for supporting the breakdown voltage. The semiconductor plugs 226, 228 are charge balanced with the adjacent portions of the substrate 202 to form a super junction region, thus improving the breakdown voltage of the device while still allowing a low on resistance $R_{ds}$. The small cell pitch achieved by the self-aligned structure allows for higher cell density which further improves the $R_{ds}$.

The method of forming a self-aligned charge balanced planar gate power DMOSFET as described in FIGS. 2A-2M can make power DMOS devices with a cell pitch (from device trench to device trench) of 12 microns or less, e.g., 8 to 12 microns, or even less than 8 microns.

Figure 3:
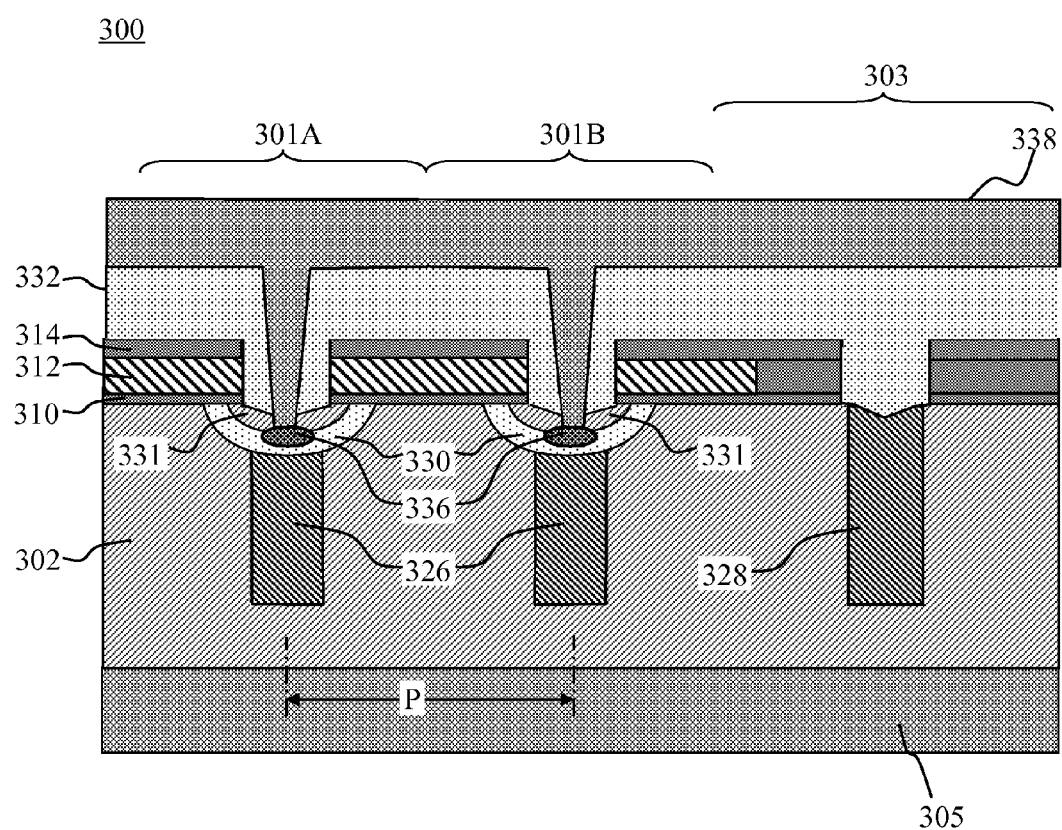
FIG. 3 is a cross-sectional view of a superjunction field effect transistor device according to an embodiment of the present invention.

According to an embodiment of the present invention, the process described above with respect to FIGS. 2A-2M may be used to produce a self-aligned charge balanced semiconductor device. By way of example, and not by way of limitation, FIG. 3 illustrates a charge balanced device 300 having two or more device cells 301A, 301B and a termination region 303. The device cells 301A, 301B are formed in a semiconductor substrate 302. Each device cell comprises a self-aligned trench filled with a semiconductor plug 326. The semiconductor plugs 326 have the opposite conductivity type as the semiconductor substrate 302 and are charge balanced with the surrounding substrate 302 regions. A source region 331 and the body contact 336 are formed in the semiconductor substrate 302 proximate a surface of the substrate and proximate the self-aligned trench that is filled by the plug 326, a planar gate 312 formed over the substrate 302 proximate the source region 331. A body region 330 is formed proximate the source region. A body contact region may be formed under an opening in the insulator layer 332 for good contact to the body region 330. A gate insulator 310, e.g., a gate oxide, can electrically insulate the gate 312 from the substrate 302, particularly from the source region 331 and body region 330. The gates 312 for different device cells 301A, 301B may be electrically connected to each other.

The cell pitch P of the one or more device cells 301A, 301B can be less than 12 microns, e.g., 8 to 12 microns, or less than 8 microns, if the trenches containing semiconductor plugs 326 for the device cells 301A, 301B are fabricated using the self-alignment technique described above.

One or more insulator layers 314, 332 may cover the gate 312 and isolate the gate from an electrically conductive layer 338 (e.g., a metal layer) that overlies the insulator layers. The electrically conductive layer 338 can make electrical contact with the source region 331 and body region 330 of each device through openings in the insulator layers 314, 332 and the semiconductor plugs 326. A voltage applied to each gate 312 can control a current between the electrically conductive layer 338 through the substrate 302 to a drain electrode 305 formed on a back side of the substrate by opening a planar channel in the body region 330 under the planar gate 312 from the source region 331 to the substrate 302.

The device 300 may optionally include a termination region 303 having a self-aligned trench formed in the substrate 302 and filled with a semiconductor plug 328 that is electrically insulated from the conductive layer 338.

As may be seen from the foregoing, embodiments of the present invention allow superjunction transistors to be formed in a self-aligned fashion that allows for higher cell pitch with fabrication steps than in the prior art. Thus, fabrication time and cost of devices that use superjunction transistors can be reduced while improving device performance.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for forming a self-aligned charge balanced semiconductor device comprising:
   a) forming one or more planar gates over a semiconductor substrate of a first conductivity type;
   b) forming one or more sidewall spacers at one or more corresponding edges of the one or more planar gates; forming a top gate insulating layer over the one or more planar gates and using the one or more planar gates and top gate insulating layer as a hard mask for etching one or more deep trenches in the semiconductor self-aligned to the planar gates;
   c) filling said deep trenches with a semiconductor material of a second conductivity type such that the deep trenches are charge balanced with the adjacent regions of the semiconductor substrate; and
   d) performing source and body implants at a top surface of the semiconductor substrate, adjacent to the planar gates, wherein prior to performing source and body implants, the sidewall spacers are removed.

2. The method of claim 1 wherein the substrate includes a heavily doped bottom layer and a less heavily doped epitaxial layer over the bottom layer.

3. The method of claim 1 wherein c) includes filling said deep trenches by selective epitaxial growth (SEG) of semiconductor material of a second conductivity type within the trenches, using the planar gate and top gate insulating layer as a hard mask.

4. The method of claim 1 wherein the sidewall spacers are made of nitride.

5. The method of claim 1 wherein c) includes filling said deep trenches by epitaxially growing semiconductor material of a second conductivity type within the trenches.

6. The method of claim 1 further comprising performing source and body implants at the top surface of the semiconductor substrate, adjacent to the planar gates.

7. The method of claim 6 wherein the source and body implants are performed self-aligned to the planar gates.

8. The method of claim 1 further comprising forming a termination region in the semiconductor substrate, the termination region having an insulating layer in place of a planar gate.

9. The method of claim 8 wherein forming the termination region includes forming a deep trench in the termination region simultaneously with forming the deep trench in b).

10. The method of claim 1 further comprising forming a top insulator layer over the semiconductor device and etching contact holes in the top insulator layer which extend down to a level of the semiconductor substrate.

11. The method of claim 10 further comprising forming a source metal on top of the device and a drain metal on a bottom of the semiconductor substrate.

12. The method of claim 1 wherein filling said deep trenches with semiconductor material further comprises filling deep trenches with silicon-germanium ($Si_xGe_y$).

13. The method of claim 1 wherein a) includes forming one or more insulator layers on a surface of a semiconductor substrate and forming the one or more planar gates on one or more of the insulator layers, whereby the planar gate is electrically insulated from the semiconductor substrate.

14. The method of claim 13, wherein b) includes forming one or more openings through the one or more insulators to expose a surface of the substrate; forming one or more sidewall spacers on one or more sidewalls of the one or more openings; and etching the substrate with a maskless etch process to form the one or more deep trenches in a self-aligned fashion, wherein the one or more sidewall spacers are resistant to attack by the etch process.

15. A self-aligned charge balanced semiconductor device made according to the method of claim 1, wherein a cell pitch between adjacent device trenches is less than 12 microns.

* * * * *